United States Patent
Yatskov

(10) Patent No.: US 10,314,203 B1
(45) Date of Patent: Jun. 4, 2019

(54) APPARATUSES, SYSTEMS, AND METHODS FOR COOLING ELECTRONIC COMPONENTS

(71) Applicant: Juniper Networks, Inc., Sunnyvale, CA (US)

(72) Inventor: Alexander I. Yatskov, Manteca, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/975,916

(22) Filed: May 10, 2018

(51) Int. Cl.
H05K 7/20 (2006.01)

(52) U.S. Cl.
CPC ..... H05K 7/20381 (2013.01); H05K 7/20318 (2013.01); H05K 7/20327 (2013.01); H05K 7/20518 (2013.01)

(58) Field of Classification Search
CPC ........... H05K 7/20318; H05K 7/20327; H05K 7/20381; H05K 7/20154; H05K 7/20254; H05K 7/20509; H05K 7/20518
See application file for complete search history.

(56) References Cited

U.S. PATENT DOCUMENTS

| | | | | |
|---|---|---|---|---|
| 5,546,274 A * | 8/1996 | Davidson | ............. | H01L 25/105 257/724 |
| 5,592,363 A * | 1/1997 | Atarashi | ............... | H01L 23/467 165/185 |
| 5,604,665 A * | 2/1997 | Chrysler | ............... | H01L 23/467 165/908 |
| 5,705,854 A * | 1/1998 | Atarashi | ............. | H01L 23/4336 257/721 |
| 6,252,774 B1 * | 6/2001 | Rife | ..................... | H01L 23/3675 257/727 |
| 6,313,399 B1 * | 11/2001 | Suntio | ................... | H01L 23/367 174/16.3 |
| 6,625,025 B1 * | 9/2003 | Duxbury | ............... | H01L 23/367 165/185 |
| 6,735,082 B2 * | 5/2004 | Self | ..................... | H01L 23/3677 165/185 |
| 6,831,359 B2 * | 12/2004 | Heilbronner | ........... | B82Y 10/00 257/706 |
| 6,836,409 B1 * | 12/2004 | Duxbury | .............. | G02B 6/4277 165/185 |
| 6,958,914 B2 * | 10/2005 | Hoss | ..................... | H01L 23/367 165/185 |
| 7,719,839 B2 * | 5/2010 | Hoss | ........................ | H01L 23/34 165/80.3 |
| 9,198,328 B1 * | 11/2015 | Kokas | ................ | H05K 7/20518 |
| 9,282,682 B2 * | 3/2016 | Ekstedt | ............. | H05K 7/20681 |
| 10,123,460 B2 * | 11/2018 | Rupp | ..................... | H01L 23/36 |
| 2005/0128705 A1 * | 6/2005 | Chu | ....................... | H01L 23/473 361/699 |

(Continued)

*Primary Examiner* — Adrian S Wilson
(74) *Attorney, Agent, or Firm* — FisherBroyles, LLP

(57) ABSTRACT

The disclosed apparatus may include a fluid-cooled plate that may be thermally coupled to a first electronic component for cooling the first electronic component by way of a cooling fluid, and a gas-cooled plate physically coupled to the fluid-cooled plate. The gas-cooled plate may be thermally coupled to a second electronic component for cooling the second electronic component by way of a gas. The gas-cooled plate may be separated from the fluid-cooled plate by a gap. Various other apparatuses, systems, and methods are also disclosed.

20 Claims, 6 Drawing Sheets

(56) References Cited

U.S. PATENT DOCUMENTS

| | | | |
|---|---|---|---|
| 2005/0263265 A1* | 12/2005 | Sheng | F28D 15/0275 165/104.21 |
| 2006/0126309 A1* | 6/2006 | Bolle | H05K 7/20436 361/719 |
| 2007/0002599 A1* | 1/2007 | Caven | H05K 1/181 363/144 |
| 2007/0291450 A1* | 12/2007 | Watanabe | H05K 7/20518 361/688 |
| 2008/0029260 A1* | 2/2008 | Hu | F28F 3/027 165/182 |
| 2009/0040723 A1* | 2/2009 | Lin | H05K 7/20254 361/699 |
| 2009/0129076 A1* | 5/2009 | Kraus | H05K 1/0204 362/234 |
| 2010/0271781 A1* | 10/2010 | Busch | H05K 7/20445 361/704 |
| 2013/0093270 A1* | 4/2013 | Kokas | H05K 7/205 310/52 |
| 2014/0043757 A1* | 2/2014 | Bernstein | H01L 23/38 361/689 |
| 2015/0208550 A1* | 7/2015 | Rugg | H05K 7/20518 361/713 |
| 2015/0366105 A1* | 12/2015 | Dunwoody | H05K 7/20509 165/76 |
| 2016/0109913 A1* | 4/2016 | Nakamura | G06F 1/206 361/679.47 |
| 2018/0249591 A1* | 8/2018 | Audemar | H05K 7/209 |

* cited by examiner

US 10,314,203 B1

APPARATUSES, SYSTEMS, AND METHODS FOR COOLING ELECTRONIC COMPONENTS

BACKGROUND

Cooling plates are often used to meet thermal demands of electronic devices, such as computers and servers. Cooling plates are a thermal management technology that often involves a heat transfer interface cooled by a flowing fluid (e.g., a liquid, gas, or two-phase fluid). Different electronic components may generate heat at different rates and have different cooling requirements. When such different electronic components are close to each other, they are usually cooled by a single cooling plate that has cooling capabilities for the electronic component(s) with the highest thermal requirements (e.g., the lowest maximum temperature and/or the highest heat generation rate).

For example, a multi-chip module may include two different semiconductor chips with different heat generation rates and different thermal requirements situated within about 2 mm from each other. The two different semiconductor chips of the multi-chip module may include, for example, an integrated circuit device that has a relatively higher maximum operating temperature and heat generation rate, and a memory device that has a relatively lower maximum operating temperature and heat generation rate. Conventional techniques for cooling such a multi-chip module include thermally coupling the entire multi-chip module over a single cooling plate with cooling capabilities tailored to draw sufficient heat from both chips to maintain the maximum temperature of the multi-chip module at the lower maximum temperature of the memory device.

The present disclosure identifies and addresses a need for improved apparatuses, systems, and methods for increasing efficiency for cooling electronic components, such as multiple different electronic components having different thermal properties and requirements.

SUMMARY

As will be described in greater detail below, the present disclosure generally relates to apparatuses, systems, and methods for cooling electronic components. In one example, an apparatus for accomplishing such a task may include a fluid-cooled plate coupled to a gas-cooled plate while a gap is maintained between the fluid-cooled plate and the gas-cooled plate.

In some embodiments, the present disclosure includes an apparatus that may include a fluid-cooled plate that is thermally coupled to a first electronic component for cooling the first electronic component by way of a cooling fluid. A gas-cooled plate may be physically coupled to the fluid-cooled plate. The gas-cooled plate may be thermally coupled to a second electronic component for cooling the second electronic component by way of a gas. The gas-cooled plate may be separated from the fluid-cooled plate by a gap.

In some examples, the fluid-cooled plate may be positioned on an upstream side of the gas-cooled plate relative to a gas flow for cooling the gas-cooled plate. The first electronic component may exhibit a first heat generation rate, and the second electronic component may exhibit a second heat generation rate that is less than the first heat generation rate. The first and second electronic components may form at least a portion of a single multi-chip module. For example, the first electronic component may include an integrated circuit device, and the second electronic component may include at least one memory device.

In some examples, the gas-cooled plate may include a bank of fins that extends laterally outward from the gas-cooled plate relative to a gas flow for cooling the gas-cooled plate. The gap between the fluid-cooled plate and the gas-cooled plate may be between about 0.2 mm and about 2.0 mm. A thermally insulating standoff may be positioned between the fluid-cooled plate and the gas-cooled plate to maintain the gap. Such a thermally insulating standoff may include at least one washer surrounding a fastener coupling the fluid-cooled plate to the gas-cooled plate. The fastener may pass across the gap through at least a portion of the thermally insulating standoff. A first portion of the gap may be occupied by the fastener and the thermally insulating standoff, and a second portion of the gap may be substantially fully filled by air. The thermally insulating standoff may, in some examples, include a polymer material. The fluid-cooled plate may maintain the first electronic component at a first temperature, and the gas-cooled plate may maintain the second electronic component at a second temperature that is lower than the first temperature.

In some embodiments, the present disclosure includes a system that may include a fluid-cooling system, a gas-cooling system, and a gas-flow generator. The fluid-cooling system may include a fluid-cooled plate for cooling at least a first electronic component, a conduit for directing a fluid through the fluid-cooled plate, and a condenser for condensing a gaseous portion of the fluid within the conduit. The gas-cooling system may include a gas-cooled plate for cooling at least a second electronic component and at least one bank of fins extending laterally outward from the gas-cooled plate. The gas-cooled plate may be coupled to the fluid-cooled plate and separated from the fluid-cooled plate by a gap. The gas-flow generator may be positioned and oriented to direct gas across the bank of fins and the condenser.

In some examples, the fluid within the conduit may include a refrigerant. The fluid-cooling system may also include another fluid-cooled plate that is not coupled to any gas-cooled plate. The other fluid-cooled plate may be for cooling a third electronic component. The fluid-cooled plate, gas-cooled plate, and condenser may be positioned such that gas directed by the gas-flow generator passes, in order, the fluid-cooled plate, the gas-cooled plate, and the condenser.

In some embodiments, the present disclosure includes a method of assembling a cooling apparatus or system. In accordance with such methods, a fluid-cooled plate and a gas-cooled plate may be physically coupled to one another while maintaining a certain gap between the fluid-cooled plate and the gas-cooled plate. The fluid-cooled plate may be thermally coupled to a first electronic component to enable the fluid-cooled plate to cool the first electronic component by way of a fluid. The gas-cooled plate may be thermally coupled to a second electronic component to enable the gas-cooled plate to cool the second electronic component by way of a gas.

In some examples, a thermally insulating standoff may be positioned between the fluid-cooled plate and the gas-cooled plate to maintain the certain gap. The first electronic component may include an application-specific integrated circuit, and the second electronic component may include a memory device positioned adjacent to the application-specific integrated circuit.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
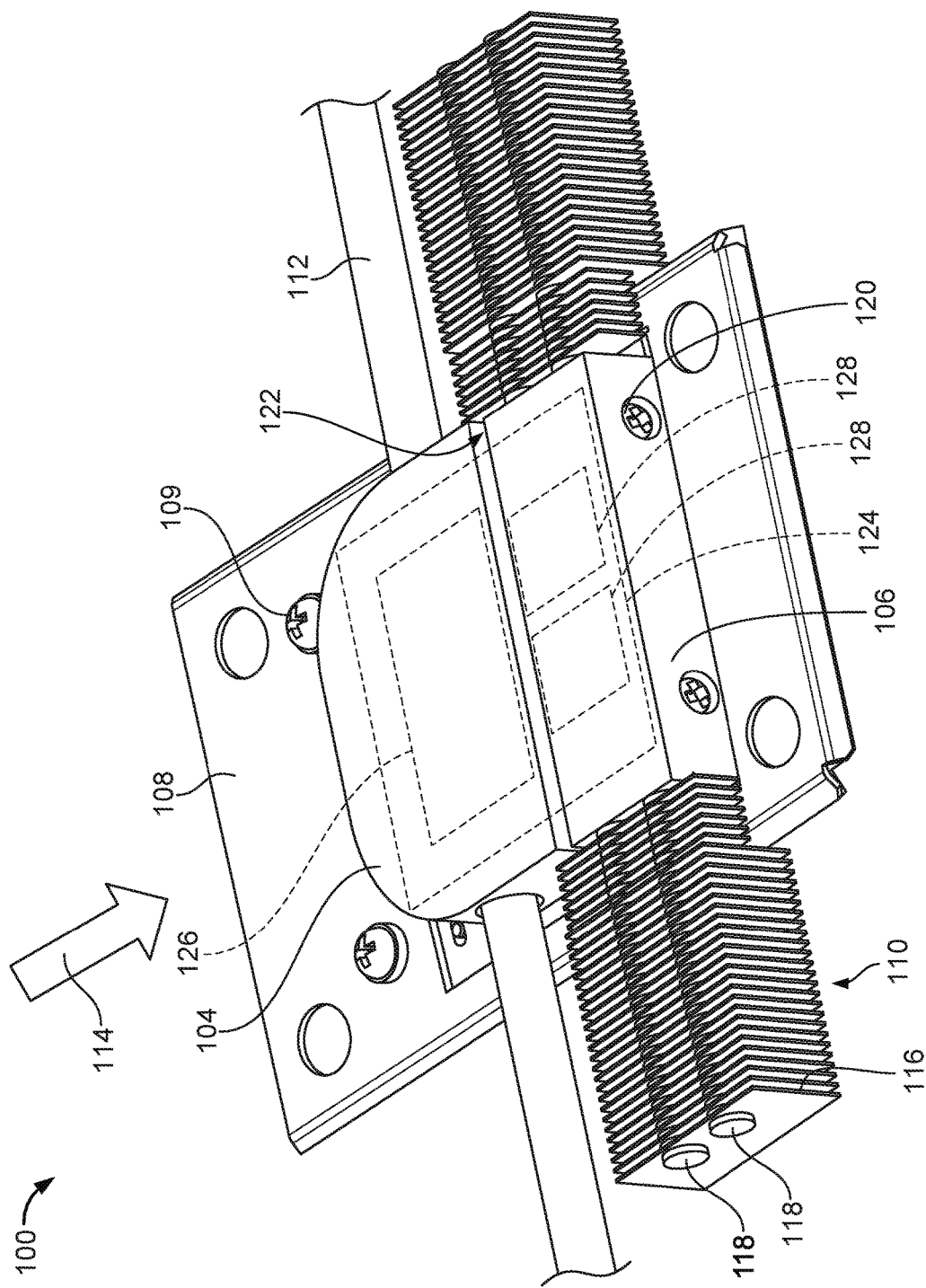
FIG. 1 is a perspective view of an apparatus for cooling electronic components according to an embodiment of the present disclosure.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, combinations, and alternatives falling within the scope of the appended claims.

DETAILED DESCRIPTION

The present disclosure describes various apparatuses, systems, and methods for cooling electronic components. As will be explained in greater detail below, embodiments of the present disclosure may provide cooling apparatuses and systems including a fluid-cooled plate for cooling a first electronic component and a gas-cooled plate for cooling a second electronic component. The gas-cooled plate may be coupled to, but separated by a gap from, the fluid-cooled plate. The apparatuses and systems of the present disclosure may enable cooling of electronic components that are located close to each other, but that have different cooling requirements. Increased cooling efficiency and electronic performance improvements may be realized by embodiments of the present disclosure.

The following will provide, with reference to FIGS. 1-4, detailed descriptions of apparatuses and systems for cooling electronic components. The discussion corresponding to FIG. 5 will provide a detailed description of an example method of cooling electronic components. In addition, the discussion corresponding to FIG. 6 will provide a detailed description of an example method of assembling an apparatus or system for cooling electronic components.

FIG. 1 illustrates a cooling apparatus 100 including a fluid-cooled plate 104 and a gas-cooled plate 106 adjacent to each other and mounted on a mounting plate 108. For example, mounting fasteners 109 may be used to secure the fluid-cooled plate 104 to the mounting plate 108. At least one bank of fins 110 may be thermally coupled to the gas-cooled plate 106 for cooling the gas-cooled plate 106. The bank of fins 110 may extend laterally outward from the gas-cooled plate 106, as illustrated in FIG. 1.

The fluid-cooled plate 104 may be configured to be cooled by a fluid passing through a conduit 112 that directs a fluid into the fluid-cooled plate 104. In some examples, the term "fluid-cooled" may refer to cooled by a fluid in a closed system, such as a liquid or a combination of liquid and gas within a conduit. For example, the fluid passing through the conduit 112 may be a two-phase refrigerant that is part liquid and part gaseous at operating temperatures and pressures. By way of example and not limitation, the conduit 112, as a whole, may contain about 70%-85% liquid refrigerant and about 15%-30% gaseous refrigerant at operating temperatures and pressures. The exact ratio of liquid and gaseous refrigerant may vary depending on a particular application or on environmental factors such as ambient temperature, for example.

The fluid-cooled plate 104 may include a thermally conductive material, such as a metal. In some embodiments, the fluid-cooled plate 104 may be configured like the cold plates described in U.S. patent application Ser. No. 15/935,464, filed Mar. 26, 2018, titled "APPARATUS, SYSTEM, AND METHOD FOR INCREASING THE COOLING EFFICIENCY OF COLD PLATE DEVICES," the entire disclosure of which is incorporated herein by reference. For example, the fluid-cooled plate 104 may include a base that is mated and/or aligned with a cover. The base may include heatsink fin structures, and the cover may include an internal wall for directing fluid from the conduits 112 and within the fluid-cooled plate 104 to pass over and across the heatsink fin structures of the base.

The gas-cooled plate 106 may include various features that contribute to and/or facilitate the cooling capabilities of the gas cooled plate 106. For example, the bank of fins 110 may include fins 116 supported by thermally conductive rods 118, which may be thermally coupled to the gas-cooled plate 106. The bank of fins 110 may be exposed to a gas flow 114, as shown in FIG. 1. The gas-cooled plate 106, fins 110, and rods 118 may each include a thermally conductive material. In some examples, the phrase "thermally conductive" may refer to a thermal conductivity of about 10 W/(m*K) or more. Example thermally conductive materials include certain metals or composite materials.

As shown in FIG. 1, in some examples, the fluid-cooled plate 104 may be positioned on an upstream side of the gas-cooled plate 106, relative to the gas flow 114. Although the gas-cooled plate 106 may be positioned downstream from the fluid-cooled plate 104 relative to the gas flow 114, as illustrated in FIG. 1, the position of the bank of fins 110 extending laterally outward from the gas-cooled plate 106 may expose the bank of fins 110 to the gas flow 114 for cooling the gas-cooled plate 106 by way of the gas flow 114. Thus, heat may be drawn away from the gas-cooled plate 106 through the rods 118 and fins 116, and may be transferred to the gas flow 114 that passes by and through the fins 116.

The gas flow 114 may include ambient air, cooled air, or another gas (e.g., nitrogen gas that is cooled or at ambient temperature). In some examples, the gas flow 114 may include air at an initial (e.g., prior to passing by the apparatus 100) temperature of up to about 46° C.

The gas-cooled plate 106 may be coupled to the fluid-cooled plate 104, such as via at least one fastener 120 (e.g., bolts, screws, pins, and/or rods). A certain gap 122 may be maintained between the gas-cooled plate 106 and the fluid-cooled plate 104, such that the gas-cooled plate 106 is substantially not in direct thermal contact with the fluid-cooled plate 104. The gap 122 may be gas-filled (e.g., air-filled), but for the fasteners 120 and any standoff that may be present to maintain the gap 122, for example. Thus, a first portion of the gap 122 may be occupied by the fasteners and any standoff, and a second portion of the gap 122 may be substantially fully filled by a gas. However, the relative placement of the gas-cooled plate 106 and the fluid-cooled plate 104 may enable the cooling apparatus 100 to cool closely situated electronic components that may have different thermal requirements.

In some examples, the term "substantially" in reference to a given parameter, property, or condition may refer to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or at least 99% met.

For example, as shown in FIG. 1 in dashed lines, a multi-chip module ("MCM") 124 including at least a first electronic component 126 and a second electronic component 128 may be thermally coupled to the fluid-cooled plate 104 and to the gas-cooled plate 106. By way of example, the first electronic component 126 of the MCM 124 may be positioned over the fluid-cooled plate 104, and the second electronic component 128 may be positioned over the gas-cooled plate 106. In the example of FIG. 1, two identical second electronic components 128 are shown side-by-side over the gas-cooled plate 106. For simplicity, the discussion relative to FIG. 1 refers to a single first electronic component 128 and a single second electronic component 126. However, embodiments of the present disclosure are applicable to other arrangements, such as a single second electronic component 128, two second electronic components 128, or more than two second electronic components 128 positioned over the gas-cooled plate 106. Similarly, any number of first electronic components 126 may be positioned over the fluid-cooled plate 104.

During operation, the first electronic component 126 may exhibit a first heat generation rate while the second electronic component 128 may exhibit a second, lower heat generation rate. By way of example and not limitation, the first electronic component 126 may generate heat at a rate of over 100 W, such as about 300 W, and the second electronic component 128 may generate heat at a rate of under 100 W, such as about 24 W. In some embodiments, the first electronic component 126 may be an integrated circuit, such as an application-specific integrated circuit ("ASIC"), and the second electronic component 128 may be or include a pair of memory devices, such as two adjacent memory chips (e.g., volatile or non-volatile memory chips, DRAM memory chips, Flash memory chips, so-called "three-dimensional" memory chips, etc.). Since the fluid-cooled plate 104 may generally exhibit a higher cooling capacity (i.e., may be configured to draw additional heat away) relative to the gas-cooled plate 106, the fluid-cooled plate 104 may be used to cool the first electronic component 126 that exhibits a higher heat generation rate than the second electronic component 128.

In some examples, the first and second electronic components 126, 128 may have different maximum operating temperatures. For example, the first electronic component 126 may have a maximum junction temperature of over 100° C. (e.g., about 115° C.) and the second electronic component 128 may have a maximum junction temperature of under 100° C. (e.g., about 95° C.). Conventional approaches for cooling such different electronic components in an MCM have included cooling the entire MCM to a single, lower temperature, such as with a single fluid-cooled plate for cooling all of the electronic components of the MCM. However, the cooling apparatus 100 may more efficiently cool the MCM 124 by substantially decoupling (by way of, for example, the gap 122) the cooling of the first electronic component 126 by the fluid-cooled plate 104 from the cooling of the second electronic component 128 by the gas-cooled plate 106. Thus, the fluid-cooled plate 104 may, during operation, maintain the first electronic component 126 at a first temperature, and the gas-cooled plate 106 may maintain the second electronic component 128 at a second temperature that is different from (e.g., lower than) the first temperature. Additionally, performance of the first and second electronic components 126, 128 may be improved by enabling each of the first and second electronic components 126, 128 to operate at a range of temperatures corresponding to the thermal properties (e.g., maximum operating temperatures) thereof. By way of example, it has been calculated that certain implementations of the cooling apparatus 100 may exhibit approximately 2 kW of additional dissipated power by allowing a temperature of the first electronic component 126 to be higher than a maximum operating temperature of the second electronic component 128.

Figure 2:
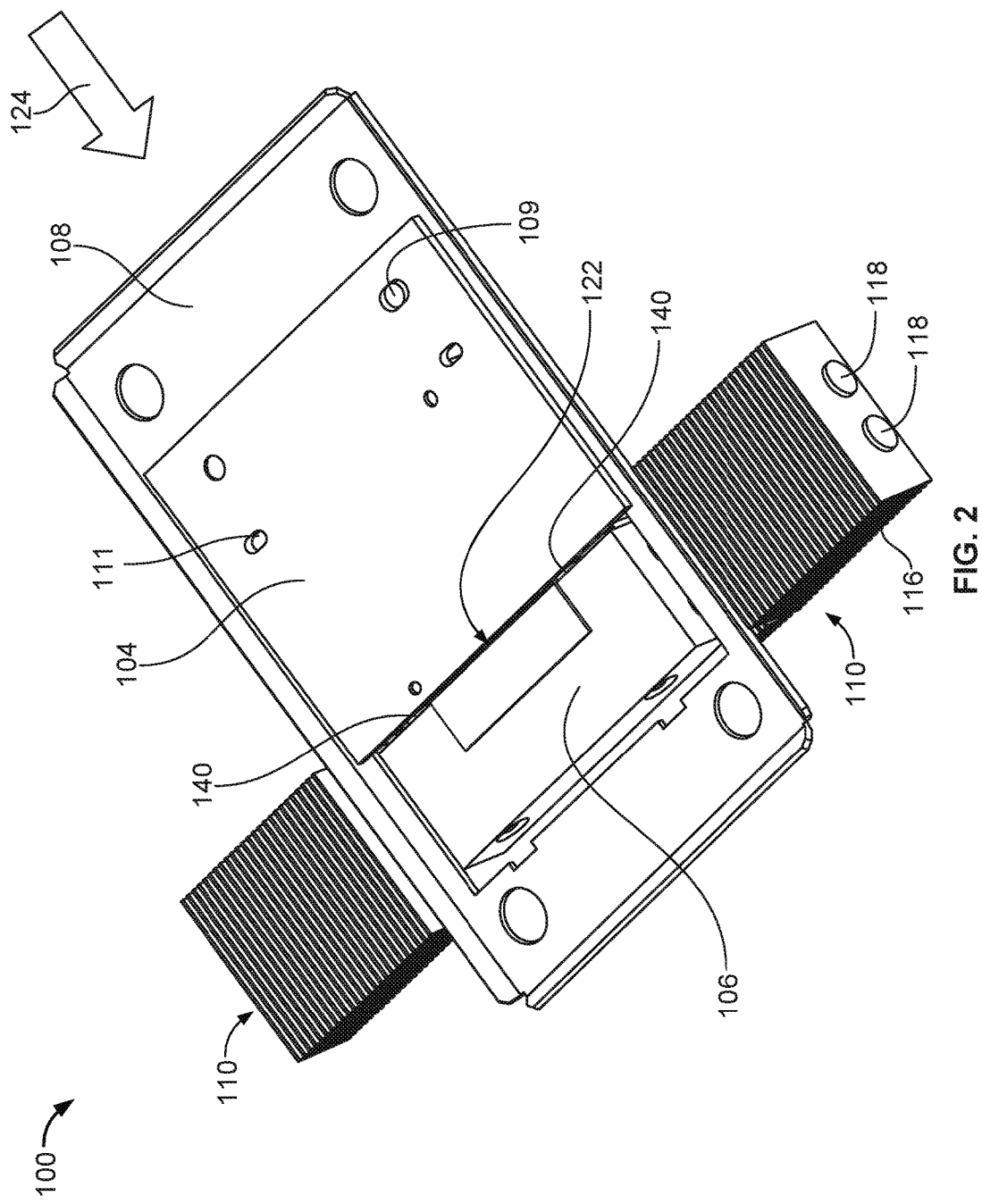
FIG. 2 is a bottom perspective view of the apparatus of FIG. 1.

FIG. 2 shows a bottom perspective view of the cooling apparatus 100, including the fluid-cooled plate 104, the gas-cooled plate 106, the mounting bracket 108, and the banks of fins 110 (including the fins 116 and rods 118) extending laterally outward from the gas-cooled plate 106. The gas-cooled plate 106 may be substantially fully physically supported via its coupling to the fluid-cooled plate 104 with the fasteners 120 (FIG. 1). The fluid-cooled plate 104 may be coupled to the mounting bracket 108 by the mounting fasteners 109. In addition, in some embodiments, alignment of an upper body of the fluid-cooled plate 104 to a support structure of the fluid-cooled plate 104 may be facilitated by alignment pins 111, for example.

As shown in FIG. 2, the gap 122 between the fluid-cooled plate 104 and the gas-cooled plate 106 may be maintained by, for example, at least one thermally insulating standoff 140 positioned in the gap 122. The standoff(s) 140 may be or include a thermally insulating material. In some examples, the phrase "thermally insulating" may refer to a thermal conductivity of about 10 W/(m*K) or less. Example thermally insulating materials suitable for use as the standoff(s) 140 include certain polymer materials (e.g., polyimide, polyethylene, polypropylene, polyvinyl chloride, nylon, polystyrene, etc.), ceramic materials, glass materials, composite materials, etc.

Figure 3:
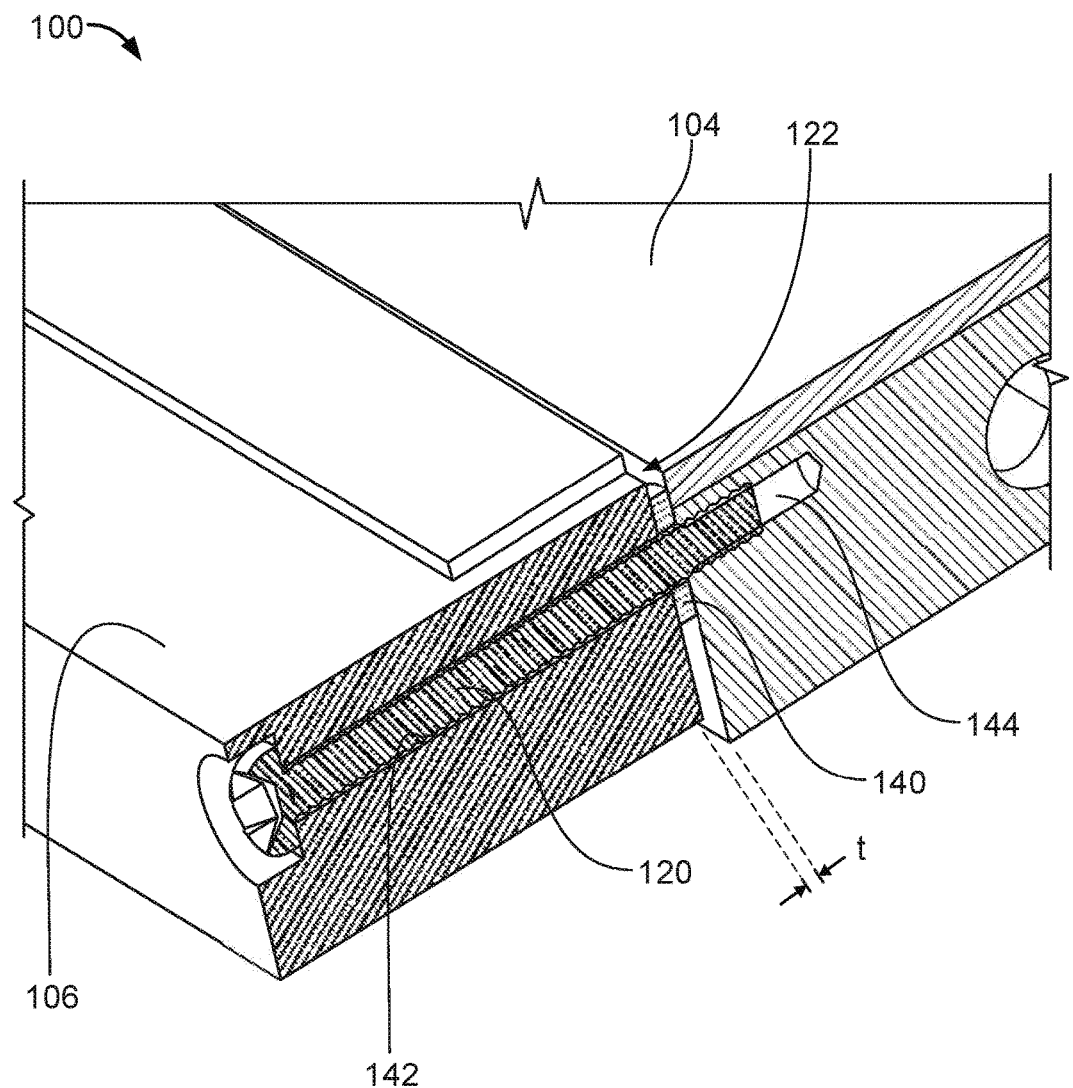
FIG. 3 is a cross-sectional bottom perspective view of a portion of the apparatus of FIG. 1.

FIG. 3 provides a detailed, cross-sectional view of the fluid-cooled plate 104 and the gas-cooled plate 106. As shown in FIG. 3, the fastener 120 may, in some examples, extend through a through-hole 142 in the gas-cooled plate 104 and into a blind hole 144 in the fluid-cooled plate 104 to couple the gas-cooled plate 104 to the fluid-cooled plate 104. In some examples, at least the blind hole 144 may include internal threads for engaging the fastener 120.

The standoff 140 may, in some embodiments, be in the form of a washer surrounding a corresponding fastener 120. The standoff 140 may have a known thickness for providing the gap 122 with a certain gap thickness t. By way of example and not limitation, the gap thickness t may be between about 2 mm and about 0.2 mm, such as about 0.7 mm. The selected gap thickness t may depend on a variety of factors, such as a distance between electronic components (e.g., the first and second electronic components 126, 128 shown in FIG. 1) to be respectively cooled by the fluid-cooled plate 104 and the gas-cooled plate 106, a desired level of thermal independence between the fluid-cooled plate 104 and the gas-cooled plate 106, space constraints, etc. Other than the fastener(s) 120 and the standoff(s) 140, the gap 122 may be substantially fully filled with a gas, such as air. In additional embodiments, another thermally insulating material (e.g., an adhesive, a polymer, etc.) may be disposed within at least a portion of the gap 122.

Accordingly, in some embodiments, direct physical and thermal contact between the fluid-cooled plate 104 and the gas-cooled plate 106 may be limited to the fastener(s) 120 and/or the standoff(s) 140. The presence of the thermally insulating standoff(s) 140 of a known thickness may provide control over the gap thickness t, while maintaining a reduced thermal conductivity between the fluid-cooled plate 104 and the gas-cooled plate 106 compared to a configuration with direct thermal contact between the fluid-cooled plate 104 and the gas-cooled plate 106. At the same time, the fluid-cooled plate 104 and the gas-cooled plate 106 may be close (e.g., within about 2 mm to about 0.2 mm) to each other for thermal coupling to closely arranged electronic components that have different thermal properties and cooling requirements (e.g., the first and second electronic components 126, 128 of the MCM 124 shown in FIG. 1). Thus, the cooling apparatus 100 may enable substantially independent cooling of different electronic components that are close to each other, for improved cooling efficiency and/or improved performance of the electronic components.

Figure 4:
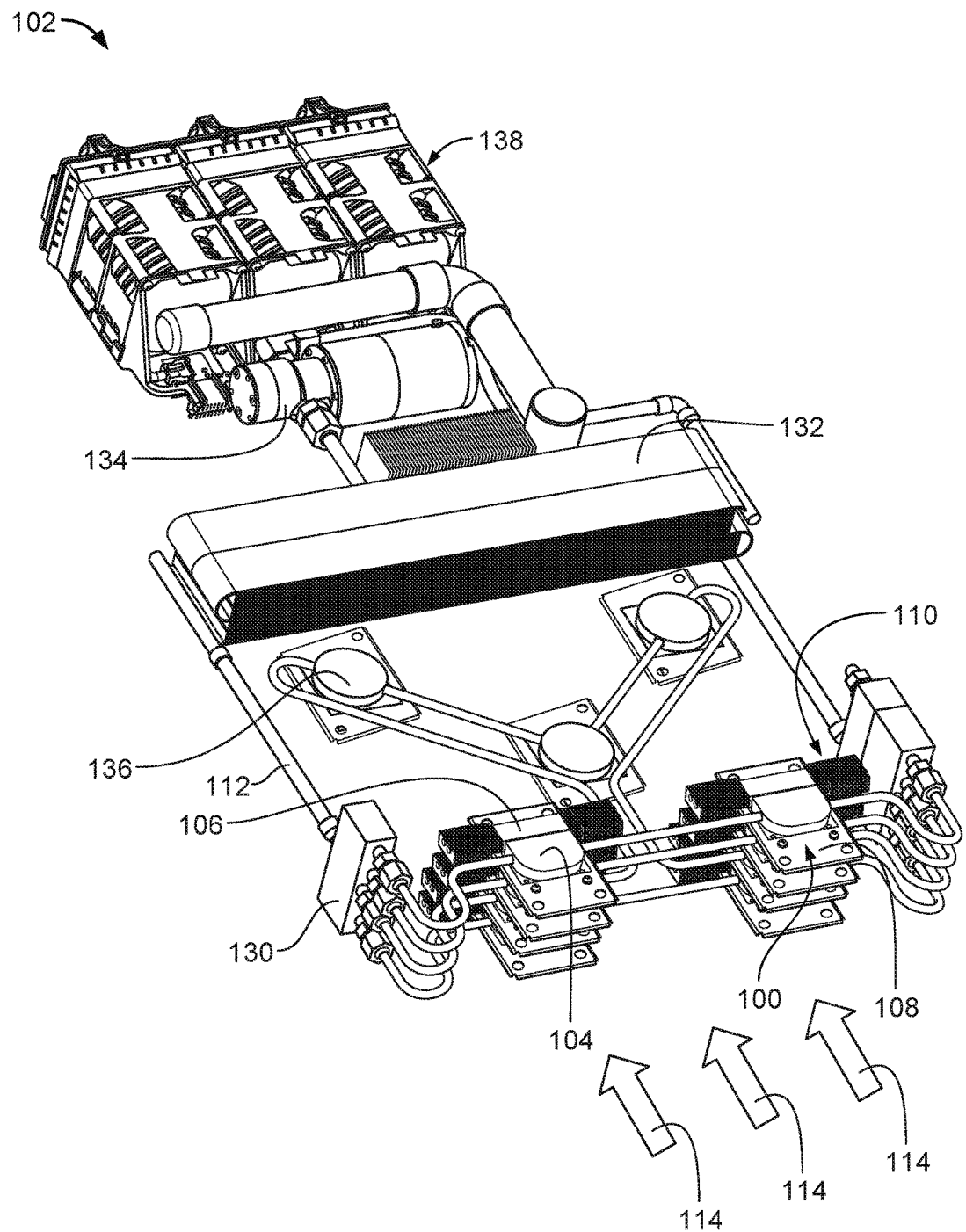
FIG. 4 is a perspective view of a system for cooling electronic components including the apparatus of FIG. 1, according to an embodiment of the present disclosure.

FIG. 4 illustrates an example cooling system 102 that incorporates at least one cooling apparatus 100, as described above. For example, the cooling system 102 of FIG. 4 may include a number of cooling apparatuses 100, each of which may be positioned and configured for cooling a different corresponding MCM 124 (FIG. 1) having electronic components with different thermal properties and cooling requirements. The cooling system 102 may also include features for cooling and managing a fluid within the conduit 112. For example, a manifold 130 may split the conduit 112 into multiple conduits 112 for respectively cooling the different cooling apparatuses 100. In addition, the manifold 130 may include control elements (e.g., valves, flow controllers, etc.) for adjusting flow rates of the multiple conduits 112, depending on cooling needs of the different cooling apparatuses 100.

The conduit 112 may direct fluid therein to a condenser 132 for condensing a gaseous portion of the fluid into a liquid portion. A pump 134 may circulate the fluid within the conduit 112 and condenser 132. In some embodiments, other fluid-cooled plates 136 (i.e., other than the fluid-cooled plates 104 of the cooling apparatuses 100 that are associated with gas-cooled plates 106) may be operatively coupled to the conduit 112 for cooling other electronic components. The other fluid-cooled plates 136 may not be coupled to any gas-cooled plate 106, in some examples.

A gas-flow generator 138 may be positioned and configured to generate the flow of gas 114 across the fluid-cooled plates 104, gas-cooled plates 106 with their associated banks of fins 110, and condenser 132. For example, the gas-flow generator 138 may include one or more fans, one or more pumps, one or more turbines, etc.

The cooling system 102 may also include one or more support substrates (e.g., printed circuit boards ("PCBs"), platforms, chassis, etc.), such as for supporting the mounting plates 108 of the cooling apparatuses 100 and the other components of the cooling system 102. Such support substrates are not shown in FIG. 4, in order to more clearly show the other elements of the cooling system 102. For example, a support substrate or a portion thereof may be provided for supporting each of the mounting plates 108.

The cooling system 102 may, in some examples, provide an efficient and versatile system for cooling electronic components (e.g., the first and second electronic components 126, 128 of the MCM 124 shown in FIG. 1) having different thermal properties and cooling requirements.

Figure 5:
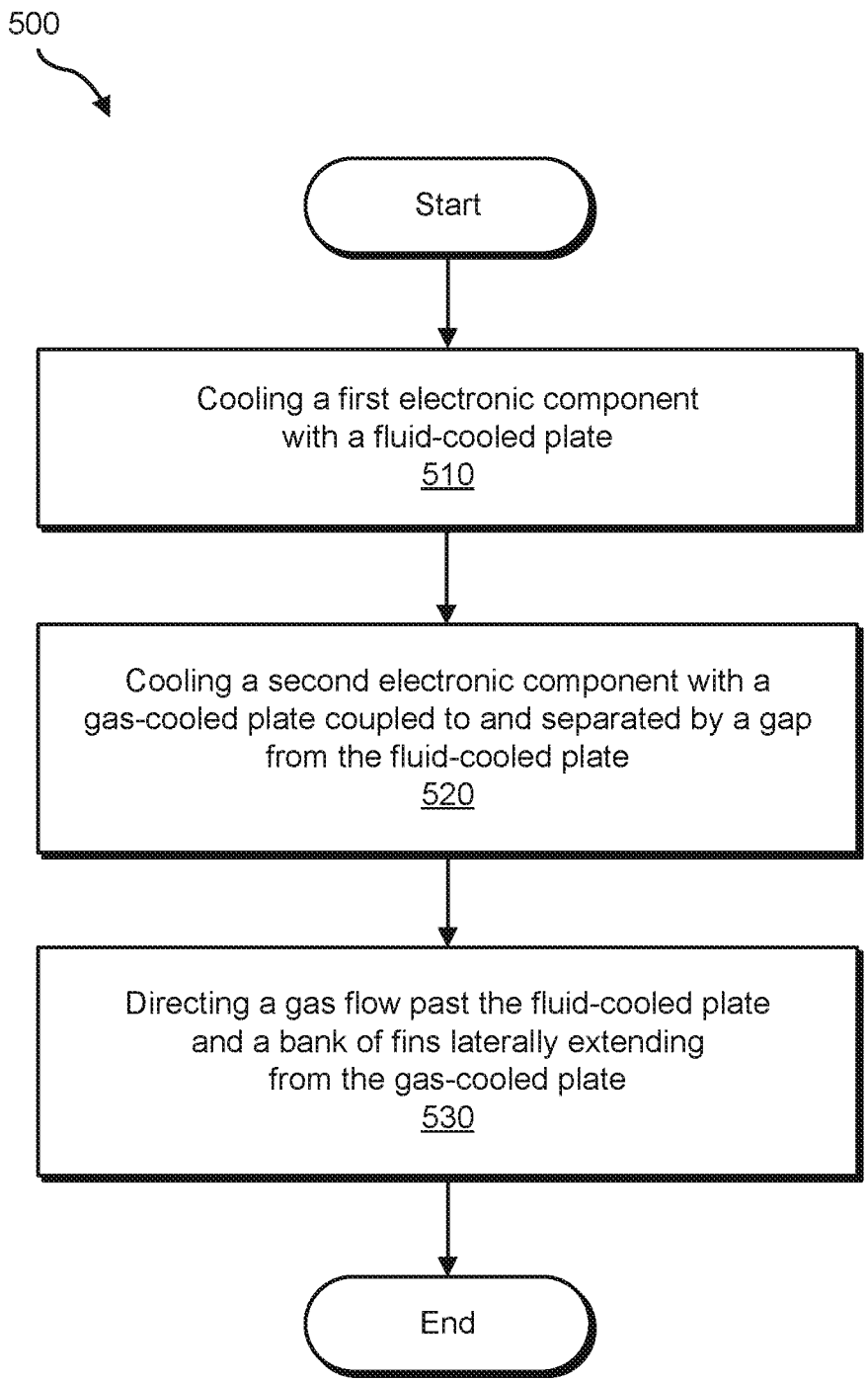
FIG. 5 is a flow diagram of a method of cooling electronic components, according to an embodiment of the present disclosure.

FIG. 5 is a flow chart that illustrates an example method 500 of cooling electronic components. In operation 510, a first electronic component may be cooled with a fluid-cooled plate. The first electronic component may exhibit certain thermal properties and cooling requirements. By way of example and not limitation, the first electronic component may be an integrated circuit (e.g., an application-specific integrated circuit) that may require over 100 W of cooling during operation. In operation 520, a second electronic component may be cooled with a gas-cooled plate. The second electronic component may exhibit different thermal properties and cooling requirements than the first electronic component. For example, the second electronic component may be a memory device that may require less than 100 W of cooling during operation. In operation 530, a gas flow may be directed past the fluid-cooled plate and a bank of fins laterally extending from the gas-cooled plate for cooling the gas-cooled plate. The operations 510, 520, and 530 may be performed in any order, and/or simultaneously.

Figure 6:
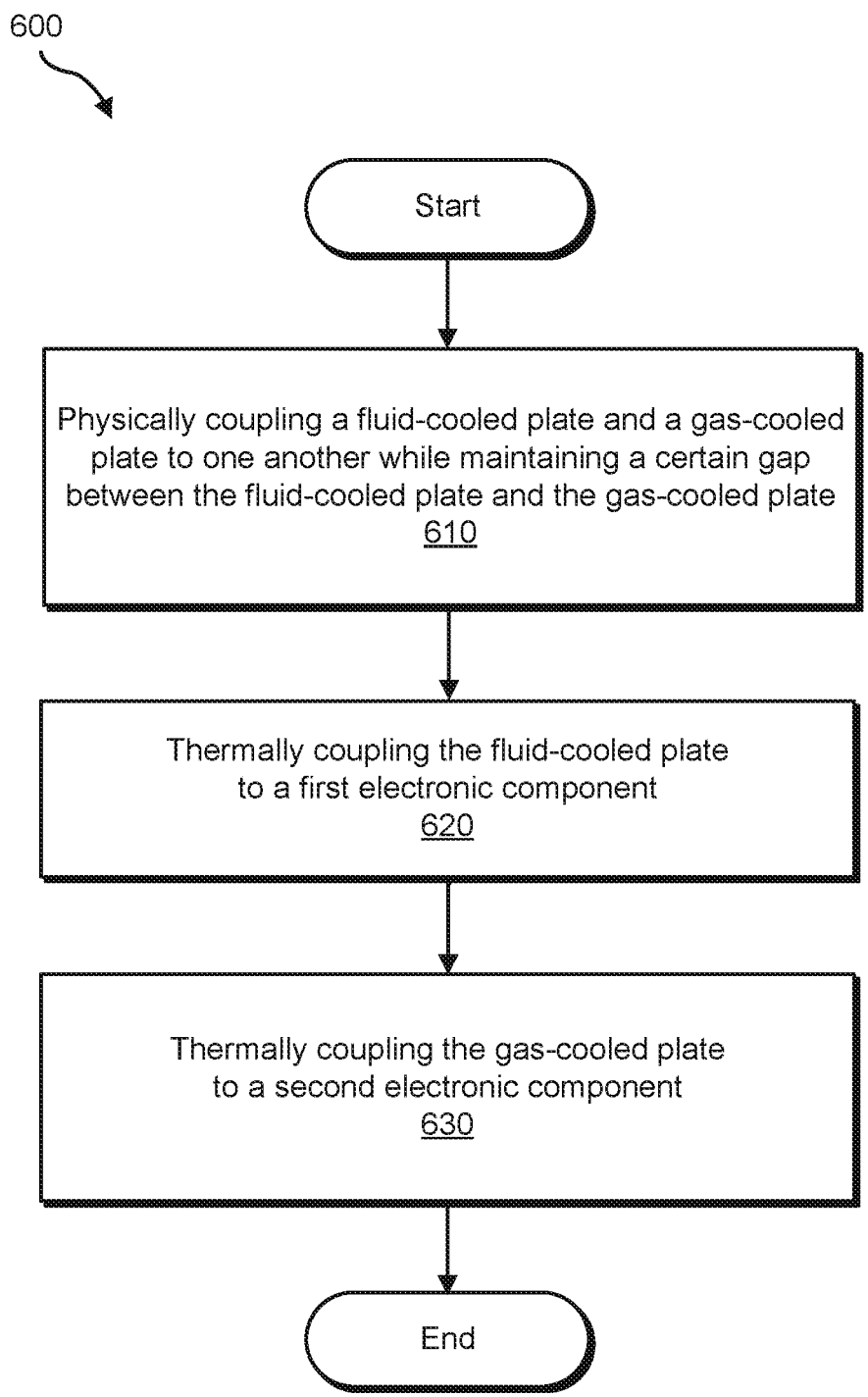
FIG. 6 is a flow diagram of a method of assembling an apparatus for cooling electronic components, according to an embodiment of the present disclosure.

Referring to FIG. 6, a method 600 of assembling a cooling apparatus or system for cooling electronic components may include physically coupling a fluid-cooled plate and a gas-cooled plate to one another, while maintaining a certain gap between the fluid-cooled plate and the gas-cooled plate, as indicated at operation 610. For example, the fluid-cooled plate and the gas-cooled plate may be coupled to each other via at least one fastener. A certain gap may be maintained between the fluid-cooled plate and the gas-cooled plate, such as by positioning a thermally insulating standoff (e.g., a polymer washer) between the fluid-cooled plate and the gas-cooled plate. In operation 620, the fluid-cooled plate may be thermally coupled to a first electronic component to enable the fluid-cooled plate to cool the first electronic component by way of a fluid. In operation 630, the gas-cooled plate may be thermally coupled to a second electronic component to enable the gas-cooled plate to cool the second electronic component by way of a gas. For example, the first and second electronic components may have different thermal properties and cooling requirements. The operations 610, 620, and 630 may be performed in any order, and/or simultaneously.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications, combinations, and variations are possible without departing from the spirit and scope of the present disclosure. The embodiments disclosed herein should be considered in all respects as illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
 a fluid-cooled plate that is thermally coupled to a first electronic component for cooling the first electronic component by way of a cooling fluid; and
 a gas-cooled plate physically coupled to the fluid-cooled plate, wherein the gas-cooled plate:
  is thermally coupled to a second electronic component for cooling the second electronic component by way of a gas; and
  is separated from the fluid-cooled plate by a gap.

2. The apparatus of claim 1, wherein the fluid-cooled plate is positioned on an upstream side of the gas-cooled plate relative to a gas flow for cooling the gas-cooled plate.

3. The apparatus of claim 1, wherein the first electronic component exhibits a first heat generation rate, and the second electronic component exhibits a second heat generation rate that is less than the first heat generation rate.

4. The apparatus of claim 1, wherein the first and second electronic components form at least a portion of a single multi-chip module.

5. The apparatus of claim 1, wherein the first electronic component comprises an integrated circuit device, and the second electronic component comprises at least one memory device.

6. The apparatus of claim 1, wherein the gas-cooled plate comprises a bank of fins extending laterally outward from the gas-cooled plate relative to a gas flow for cooling the gas-cooled plate.

7. The apparatus of claim 1, wherein the gap is between about 0.2 mm and about 2.0 mm.

8. The apparatus of claim 1, further comprising a thermally insulating standoff positioned between the fluid-cooled plate and the gas-cooled plate to maintain the gap.

9. The apparatus of claim 8, wherein the thermally insulating standoff comprises at least one washer surrounding a fastener coupling the fluid-cooled plate to the gas-cooled plate.

10. The apparatus of claim 9, wherein the fastener passes across the gap through at least a portion of the thermally insulating standoff.

11. The apparatus of claim 10, wherein:
 a first portion of the gap is occupied by the fastener and the thermally insulating standoff; and
 a second portion of the gap is substantially fully filled by air.

12. The apparatus of claim 8, wherein the thermally insulating standoff comprises a polymer material.

13. The apparatus of claim 1, wherein the fluid-cooled plate maintains the first electronic component at a first temperature, and the gas-cooled plate maintains the second electronic component at a second temperature that is lower than the first temperature.

14. A system comprising:
 a fluid-cooling system comprising:
  a fluid-cooled plate for cooling at least a first electronic component;
  a conduit for directing a fluid through the fluid-cooled plate; and
  a condenser for condensing a gaseous portion of the fluid within the conduit;
 a gas-cooling system comprising:
  a gas-cooled plate for cooling at least a second electronic component, wherein the gas-cooled plate is coupled to the fluid-cooled plate and separated from the fluid-cooled plate by a gap; and
  at least one bank of fins extending laterally outward from the gas-cooled plate; and
 a gas-flow generator positioned and oriented to direct gas across the bank of fins and the condenser.

15. The system of claim 14, wherein the fluid within the conduit comprises a refrigerant.

16. The system of claim 14, wherein the fluid-cooling system comprises another fluid-cooled plate that is not coupled to any gas-cooled plate, wherein the other fluid-cooled plate is for cooling a third electronic component.

17. The system of claim 14, wherein the fluid-cooled plate, gas-cooled plate, and condenser are positioned such that gas directed by the gas-flow generator passes, in order, the fluid-cooled plate, the gas-cooled plate, and the condenser.

18. A method comprising:
 physically coupling a fluid-cooled plate and a gas-cooled plate to one another while maintaining a certain gap between the fluid-cooled plate and the gas-cooled plate;
 thermally coupling the fluid-cooled plate to a first electronic component to enable the fluid-cooled plate to cool the first electronic component by way of a fluid; and
 thermally coupling the gas-cooled plate to a second electronic component adjacent to the first electronic component to enable the gas-cooled plate to cool the second electronic component by way of a gas.

19. The method of claim 18, further comprising positioning a thermally insulating standoff between the fluid-cooled plate and the gas-cooled plate to maintain the certain gap.

20. The method of claim 18, wherein:
 the first electronic component comprises an application-specific integrated circuit; and
 the second electronic component comprises a memory device positioned adjacent to the application-specific integrated circuit.

* * * * *